United States Patent
Hwang et al.

[11] Patent Number: 5,462,890
[45] Date of Patent: Oct. 31, 1995

[54] METHOD FOR MAKING A TUNGSTEN PLUG OF A SEMICONDUCTOR DEVICE

[75] Inventors: Sung B. Hwang; Keun Y. Lee, both of Kyoungki-do, Rep. of Korea

[73] Assignee: Hyundai Electronics Industries, Co., Ltd., Kyoungki-Do, Rep. of Korea

[21] Appl. No.: 144,879

[22] Filed: Oct. 27, 1993

[30] Foreign Application Priority Data

Oct. 30, 1992 [KR] Rep. of Korea ............... 92-20143

[51] Int. Cl.$^6$ ............... H01L 21/44; H01L 21/285
[52] U.S. Cl. ............... 437/187; 427/99; 427/253
[58] Field of Search ............... 437/187, 192, 437/200; 427/99, 253

[56] References Cited

U.S. PATENT DOCUMENTS

| | | | |
|---|---|---|---|
| 4,777,061 | 11/1988 | Wu et al. | 437/187 |
| 5,028,565 | 7/1991 | Chang et al. | 437/192 |

OTHER PUBLICATIONS

C. C. Tang, et al. "Plasma–Enhanced Deposition of Tungsten, Molybdenum, and Tungsten Silicide Films" Solid State Tech. Mar. 1983 pp. 125–128.
A. J. P. Van Maaren et al. "Tungsten Deposition on GaAs using WF and Atomic Hydrogen" J. Appl. Phys. 73(4) 15 Feb. 1993.

Primary Examiner—Olik Chaudhuri
Assistant Examiner—C. Everhart
Attorney, Agent, or Firm—Morgan & Finnegan

[57] ABSTRACT

A method for making a tungsten plug of a semiconductor device is disclosed.

The method comprises the steps of: applying an etching process to a predetermined region of an insulating film formed a conductive layer to form a contact hole, said conductive layer being exposed at the predetermined region; adding a reactive gas containing tungsten metal ions into hydrogen radical plasma to form a tungsten thin film over said insulating film and said exposed conductive layer, said tungsten thin film having a good adhesiveness to said insulating film and a very thin thickness; depositing a blanket tungsten thin film in a predetermined thickness on the resulting structure; applying an etching process to said blanket tungsten thin film and subsequently to said tungsten thin film to expose the upper surface of said insulating film.

The tungsten plug formed in accordance with the present invention contains no key holes therein since the tungsten thin film is formed in a uniform thickness. In addition, absence key hole in the tungsten plug allows the etch back process for blanket tungsten to be easily controlled. Accordingly, the high production yield and the high reliability of semiconductor device are accomplished by the inventive method.

4 Claims, 2 Drawing Sheets

METHOD FOR MAKING A TUNGSTEN PLUG OF A SEMICONDUCTOR DEVICE

BACKGROUND OF THE INVENTION

1. Field of the Invention

The present invention relates, in general, to a method for making a tungsten plug of a highly integrated semiconductor device, and more particularly to improvements in easily controlling etch back processes for blanket tungsten and in key hole in the contact hole along with the method.

2. Description of the Prior Art

When carrying out multilayer wiring process for a highly integrated memory device or logic device, there is generally utilized a plug such that a metal is buried in a contact hole in order to vertically connect a metal wire with a lower conductive layer via the contact hole.

Hereinafter, description for a conventional method for making a tungsten plug will be given along with the problems generated therefrom for better understanding of the background of the invention.

For the purpose of allowing an upper tungsten to come into contact with lower silicon substrate, initially, the predetermined portion of an insulating film which is formed on the silicon substrate is subjected to an etch process to form a contact hole and then, a conjunction layer is formed on the insulating film by sputtering or chemical vapor deposition to improve the adhesiveness of tungsten thin film. Subsequently, blanket tungsten is deposited on the resulting structure, followed by the application of etching process to a predetermined portion of the blanket tungsten and to the conjunction layer. As a result of performing these steps, a tungsten plug is formed.

However, the conjunction layer is deposited in a inhomogeneous thickness in the contact hole. In other words, the conjunction layer is deposited in a large quantity, e.g. thickly, on the upper portion of the contact hole whereas it is deposited in a small quantity, e.g. thinly, on the lower portion of the contact hole. As a result, the upper portion of contact becomes narrower than the lower portion. Therefore, even if blanket tungsten is deposited, there occurs a key hole in the contact hole, which, in turn, complicates etch back processes for the blanket tungsten. For example, it is difficult to control etching process for the blanket tungsten and the junction layer. In addition, the difficult control for etching results in an expansion of key hole at the plug formed in the contact hole. Consequently, the production yield becomes lowered due to the difficulty of control for process as well as device manufactured by the conventional method is deteriorated in reliability.

SUMMARY OF THE INVENTION

Therefore, an object of the present invention is to solve the aforementioned problems encountered in the prior arts and to provide a method for making a tungsten plug of a semiconductor device, in which, without forming a conjunction layer, a reactive gas containing tungsten metal ions is added into the hydrogen radical plasma which is in a state of plenty of hydrogen atom, so as to form a tungsten film having a good adhesiveness to an insulating film in a constant thickness and a blanket tungsten film is deposited with in-situ process e.g. successively by means of chemical vapor deposition, followed by the application of etching process to the tungsten thin film which is placed on the insulating film, thereby controlling etch back process for blanket tungsten easily and preventing a key hole in the contact hole.

In accordance with the present invention, this object can be accomplished by providing a method for making a tungsten plug of semiconductor device, comprising the steps of: applying an etching process to a predetermined region of an insulating film formed on a conductive layer to form a contact hole, said conductive layer being exposed at the predetermined region; adding a reactive gas containing tungsten metal ions into hydrogen radical plasma to form a tungsten thin film over said insulating film and said exposed conductive layer, said tungsten thin film having a good adhesiveness to said insulating film and a very thin thickness; depositing a blanket tungsten thin film in a predetermined thickness on the resulting structure; applying an etching process to said blanket tungsten thin film and subsequently to said tungsten thin film to expose the upper surface of said insulating film.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the: various ways in which the principles of the invention may be employed.

DETAILED DESCRIPTION OF THE PREFERRED EMBODIMENTS

Figure 1:
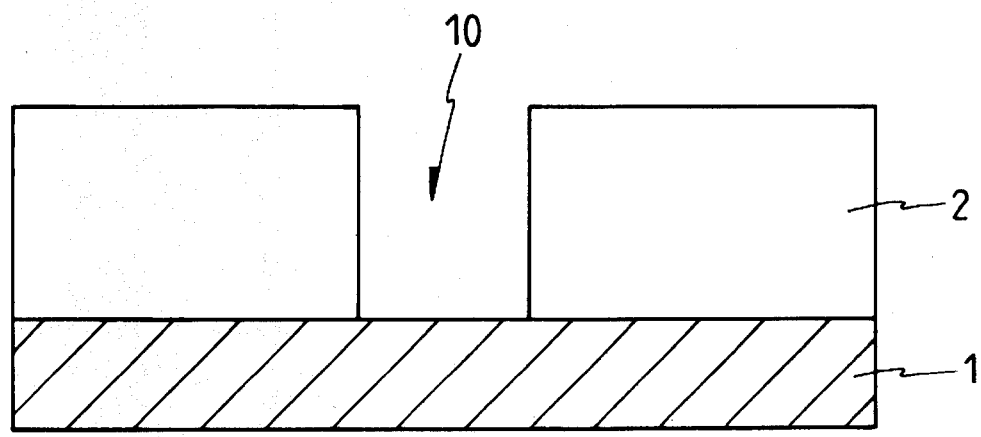
FIG. 1 is a schematic cross-sectional view illustrating the step of forming a contact hole according to an embodiment of the invention.

Hereinafter, a preferred embodiment of the invention will be described in detail with reference to the drawings, wherein like reference numerals designate like parts in all figures. FIGS. 1 to 4 are cross-sectional views illustrating the steps of the method according to the present invention, respectively.

Figure 2:
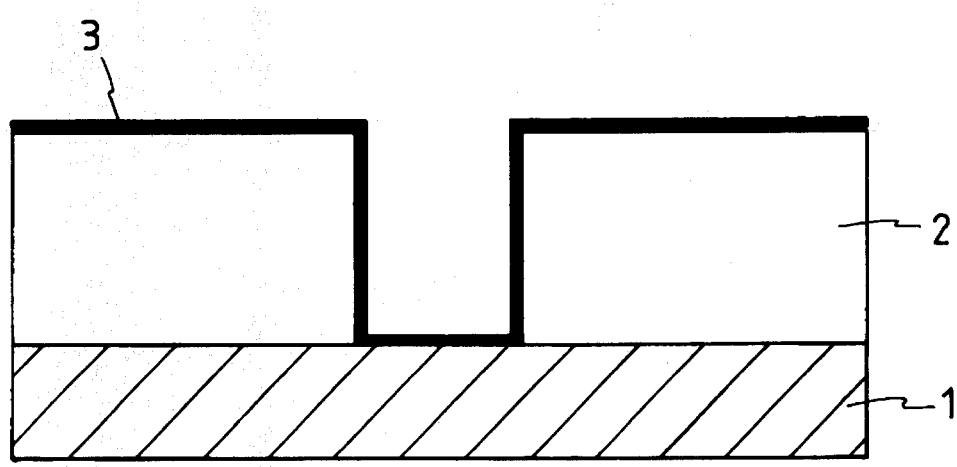
FIG. 2 is a schematic cross-sectional view illustrating the step of forming a tungsten thin film according to an embodiment the invention.

First, referring to FIG. 2, there is a schematic sectional view illustrating a first step of the method according to the invention. As shown in FIG. 1, over a conductive layer 1, for example, a silicon substrate, a polysilicon layer or a metal wire, is formed an insulating film 2, for example, an oxide film which is subsequently subjected to the treatment of lithography to etch a predetermined region of the insulating film 2. As a result of the lithography, a contact hole 10 is formed to expose the conductive layer at the predetermined region.

The step of depositing a tungsten thin film is to be explained with reference to FIG. 2. For this, using a blanket tungsten-depositing equipment, a reactive gas containing tungsten is added to a hydrogen radical plasma generated from the equipment under a pressure of a few torrs and an electric power of tens to hundreds watts so as to deposit a tungsten thin film 3 with a good adhesiveness over the insulating film 2 and the exposed conductive layer. Upon introduction into the hydrogen radical plasma, the reactive gas containing tungsten forms reactive species, preferably including radicals and tungsten ions.

Figure 3:
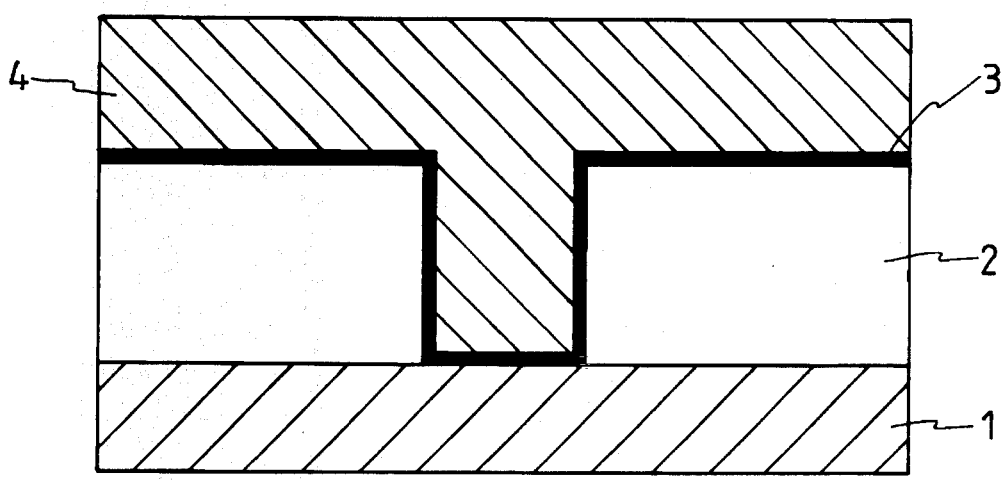
FIG. 3 is a schematic cross-sectional view illustrating the step of forming a blanket tungsten thin film according to an embodiment of the invention.

Referring now to FIG. 3, there is a cross-sectional view illustrating the step that is undertaken to deposit a blanket tungsten thin film in a predetermined thickness with in-situ process, e.g. successively by means of the chemical vapor deposition until the contact hole is buried therewith.

Figure 4:
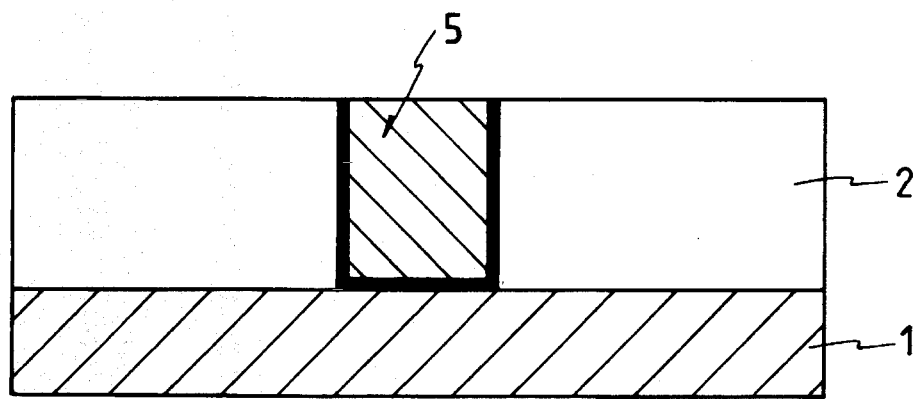
FIG. 4 is a schematic cross-sectional view illustrating the step of forming a tungsten plug according to an embodiment of the invention.

Finally, turning to FIG. 4, there is a tungsten plug which is formed by etching the tungsten thin film 3 and the blanket tungsten thin film 4 with fluorine radical plasma until the upper surface of the insulating film 2 is exposed.

As described above, the tungsten plug formed in accordance with the present invention contains no key holes therein since the tungsten thin film 3 is formed in a uniform thickness. In addition, absence of key hole in the tungsten plug allows the etch back process for the blanket tungsten to be easily controlled. Accordingly, the high production yield and the high reliability of semiconductor device are accomplished by the inventive method.

Whilst the present invention has been described with reference to certain preferred embodiments, it will be appreciated by those skilled in the art that numerous variations and modifications are possible without departing from the spirit or scope of the invention as broadly described.

What is claimed is:

1. A method for making a tungsten plug of a highly integrated semiconductor device, comprising the steps of:

applying an etching process to a region of an insulating film formed on a conductive layer to form a contact hole within said region, said conductive layer being exposed at the region;

adding a reactive gas containing tungsten into hydrogen radical plasma to form a tungsten thin film over said insulating film and said exposed conductive layer, said tungsten thin film having a good adhesiveness to said insulating film and a very thin, uniform thickness;

depositing a blanket tungsten thin film in a thickness on the resulting structure;

applying an etching process to said blanket tungsten thin film and subsequently to said tungsten thin film to expose the upper surface of said insulating film.

2. A method according to claim 1, wherein said hydrogen radical plasma is generated in a blanket tungsten deposition equipment under the conditions of radio frequency power having a value of tens to hundreds of watts at a pressure of a few torr.

3. A method according to claim 1, wherein said blanket tungsten thin film is deposited successively to the deposition of said tungsten thin film.

4. A method according to claim 1, wherein said step of adding a reactive gas containing tungsten into a hydrogen radical plasma provides tungsten metal ions.

* * * * *